(12) United States Patent
Jeon et al.

(10) Patent No.: US 7,397,409 B2
(45) Date of Patent: Jul. 8, 2008

(54) MULTI-BIT PIPELINE ANALOG-TO-DIGITAL CONVERTER HAVING SHARED AMPLIFIER STRUCTURE

(75) Inventors: Young Deuk Jeon, Daejeon (KR); Seung Chul Lee, Daejeon (KR); Kwi Dong Kim, Daejeon (KR); Jong Kee Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/695,143

(22) Filed: Apr. 2, 2007

(65) Prior Publication Data

US 2008/0068237 A1 Mar. 20, 2008

(30) Foreign Application Priority Data

Sep. 14, 2006 (KR) ............... 10-2006-0089083

(51) Int. Cl.
*H03M 1/12* (2006.01)
(52) U.S. Cl. ..................... 341/156; 341/155
(58) Field of Classification Search .......... 341/150–160
See application file for complete search history.

(56) References Cited

U.S. PATENT DOCUMENTS

| | | | |
|---|---|---|---|
| 6,295,016 B1 | 9/2001 | Chiang | |
| 6,600,440 B1 * | 7/2003 | Sakurai | ................. 341/155 |
| 6,617,992 B2 * | 9/2003 | Sakurai | ................. 341/161 |

(Continued)

FOREIGN PATENT DOCUMENTS

JP 10-308670 11/1998

(Continued)

OTHER PUBLICATIONS

Jeon, Y., et al., "A 5-mW 0.26-mm$^2$ 10-bit 20-MS/s pipelined CMOS ADC with multi-stage amplifier sharing technique." Sep. 2006. *In Proc. European Solid-State Circuits Conference*, pp. 544-547.

(Continued)

*Primary Examiner*—Lam T Mai
(74) *Attorney, Agent, or Firm*—Ladas & Parry LLP

(57) ABSTRACT

A multi-bit pipeline analog-to-digital converter (ADC) having a shared amplifier structure includes: a sample-and-hold amplifier (SHA) for sampling and holding an input analog voltage and removing a sampling error of the input voltage; N-bit flash ADCs of first to K-th stages receiving analog signals, converting them into digital signals and outputting the digital signals; N-bit multiplying digital-to-analog converters (MDACs) of first to K-th stages converting differences between the digital signals output from the N-bit flash ADCs and output signals of preceding stages back into analog signals and outputting the analog signals; and a three-stage amplifier connected to an output of the N-bit MDAC of the first stage at a first clock and an output of the SHA at a second clock, wherein intergers N>= and K>=2. An amplifier can be shared between an SHA and an MDAC of a first stage, thereby reducing power consumption and chip size.

In the multi-bit pipeline ADC, an amplifier can be shared between an SHA consuming much power and an MDAC of a first stage, so that power consumption and chip size can be reduced.

6 Claims, 3 Drawing Sheets

U.S. PATENT DOCUMENTS

| | | | |
|---|---|---|---|
| 6,799,823 B2 * | 10/2004 | Miquel et al. | 347/15 |
| 6,954,169 B1 | 10/2005 | Min | |
| 7,187,318 B1 * | 3/2007 | Lee et al. | 341/155 |

FOREIGN PATENT DOCUMENTS

| | | |
|---|---|---|
| JP | 2002-190736 | 7/2002 |
| JP | 2002-314420 | 10/2002 |
| JP | 2005-244343 | 9/2005 |
| KR | 1019970005828 | 4/1997 |
| KR | 10-0190531 | 1/1999 |
| KR | 1020050081044 | 8/2005 |

OTHER PUBLICATIONS

Nagaraj, K., et al., "A 250-mW, 8-b, 52-Msamples/s Parallel-Pipelined A/D Converter with Reduced Number of Amplifiers." Mar. 1997. *IEEE Journal of Solid-State Circuits,* vol. 32, No. 3, pp. 312-320.

Yu, P., et al., "A 2.5-V, 12-b, 5-Msample/s Pipelined CMOS ADC." Dec. 1996. *IEEE Journal of Solid-State Circuits,* vol. 31, No. 12, pp. 1854-1861.

Korean Notice of Patent Grant dated Apr. 24, 2008 for the corresponding application KR 10-2006--0089083.

* cited by examiner

MULTI-BIT PIPELINE ANALOG-TO-DIGITAL CONVERTER HAVING SHARED AMPLIFIER STRUCTURE

CROSS-REFERENCE TO RELATED APPLICATION

This application claims priority to and the benefit of Korean Patent Application No. 2006-0089083, filed Sep. 14, 2006, the disclosure of which is incorporated herein by reference in its entirety.

BACKGROUND

1. Field of the Invention

The present invention relates to a multi-bit pipeline analog-to-digital converter (ADC) having a shared amplifier structure, and more particularly, to technology capable of minimizing power consumption and reducing a chip size by enabling sharing of an amplifier used in a multi-bit pipeline ADC.

2. Discussion of Related Art

In order to process an image signal in an image system, a small analog signal needs to be converted into a digital signal sensitive to a noise. The conversion of the analog signal into the digital signal is performed using an ADC.

Since image data output from a sensor is very minute, the imaging system requires a high-resolution ADC capable of distinguishing a small signal. In addition to the imaging system, communication systems and image processing/application systems, such as mobile communication devices, asynchronous digital subscriber loops (ADSLs), IMT-2000, digital camcorders, and high-definition televisions (HDTVs), also require high-resolution ADCs that have a high resolution (12-/14 bit) and a high sampling rate of several tens of MHz.

Among the variety of known ADC structures, a flash ADC, a folding ADC, a subranging ADC, and a pipeline ADC are able to process signals at a high-speed. Recently, a pipeline ADC structure, which consumes low power and occupies a small area, has been widely used to satisfy both conditions of high-speed signal processing and a high resolution at the same time.

A conventional pipeline ADC may be classified into a single-bit structure, which decides 1 bit for each stage, or a multi-bit structure, which decides 2 bits or more for each stage. In general, a high-resolution pipeline ADC has adopted the multi-bit structure to a greater extent than the single-bit structure which requires many stages, because the multi-bit structure decides many bits at each (a first) stage to lessen the influence of the next stage and optimize power consumption and an occupied area.

FIG. 1 is a circuit diagram of a conventional multi-bit pipeline ADC.

Referring to FIG. 1, the multi-bit pipeline ADC includes several stages, so that an analog input signal $V_{in}$ passes through a sample-and-hold amplifier (SHA) 10 and is converted into a digital signal at each of stages $ST_1$ to $ST_k$, and is output. For example, the stage $ST_1$ includes an N-bit flash ADC 20 and an N-bit multiplying digital-to-analog converter (MDAC) 30. The N-bit flash ADC 20 receives an analog signal from a preceding stage, converts the analog signal into a digital signal, and outputs the digital signal. The N-bit MDAC 30 converts a difference between the digital signal output from the N-bit flash ADC 20 and the preceding-stage output signal into an analog signal and outputs the amplified analog signal to the next stage.

When analog-to-digital conversion is to produce 4 bits at each stage, the following operation is performed at each stage: a 4-bit flash ADC 20 receives an input analog signal and outputs a 4-bit digital signal, and a 4-bit MDAC 30 converts a difference between the digital signal output from the 4-bit flash ADC 20 and the preceding-stage output signal into an analog signal and outputs the amplified analog signal to the next stage.

In other words, the multi-bit pipeline ADC constituted as shown in FIG. 1 converts a part of an analog signal into a digital signal at each stage, so that the signal conversion is achieved as intended.

In the multi-bit pipeline ADC constituted as shown in FIG. 1, the SHA 10 used at an input terminal to remove a sampling error of input voltages between the MDAC and the flash ADC of the first stage comprises one amplifier and a plurality of capacitors. Also, this circuit needs a wide bandwidth as well as a large phase margin of about 70–80 degrees to achieve high speed and high linearity. Therefore, as the operation speed of the ADC increases, a large amount of power is consumed by the amplifier of the SHA 10.

Various amplifier sharing method are suggested to reduce such power consumption. For example, an amplifier can be shared between adjacent pipeline stages operating opposite clock phase. However, this scheme is not adaptable to a front-end SHA and following first-stage MDAC which take up a major portion of the overall ADC power, because the SHA and MDAC have large differences in their operating conditions, especially, in multi-bit-per stage pipelined ADCs. Thus, most methods reduce power consumption by sharing an amplifier between only MDAC 30 blocks having the same structure and feedback factor as shown in E of FIG. 1.

More specifically, the SHA 10 outputs an input signal using the same value and thus has a feedback factor of about 1, and the MDAC 30 amplifies an input signal by a factor of 4 or more and thus has a feedback factor of a quarter or less. Due to such a difference in feedback factor, it is not possible to simultaneously satisfy bandwidths and phase margins required by each block when the same amplifier is shared. What's more, sharing the same amplifier between the SHA 10 and the MDAC 30 increases power consumption and chip size. For these reasons, it is difficult to share an amplifier between the SHA 10 and the MDAC 30. Thus, an amplifier is only shared between the MDAC 30 blocks.

Thus, in order to reduce the power consumption and chip size of a multi-bit pipeline ADC, there is need of a way to share an amplifier between an SHA and an MDAC while satisfying requirements on the operation characteristics of each block.

SUMMARY OF THE INVENTION

The present invention is directed to a multi-bit pipeline analog-to-digital converter (ADC) capable of reducing power consumption and chip size by allowing an amplifier to be shared between a sample-and-hold amplifier (SHA) consuming much power and a multiplying digital-to-analog converter (MDAC).

One aspect of the present invention provides multi-bit pipeline ADC having a shared amplifier structure, comprising: an SHA for sampling and holding an input analog voltage and removing a sampling error of the input voltage; N-bit flash ADCs of first to K-th stages for receiving analog signals, converting them into digital signals and outputting the digital signals; N-bit MDACs of first to K-th stages for converting differences between the digital signals output from the N-bit flash ADCs and output signals of preceding stages back into analog signals and outputting the amplified analog signals; and a three-stage amplifier connected with an output of the N-bit MDAC of the first stage at a first clock and the output of the SHA at a second clock, wherein N is an integer greater than or equal to 1 and K is an integer greater than or equal to 2.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1:
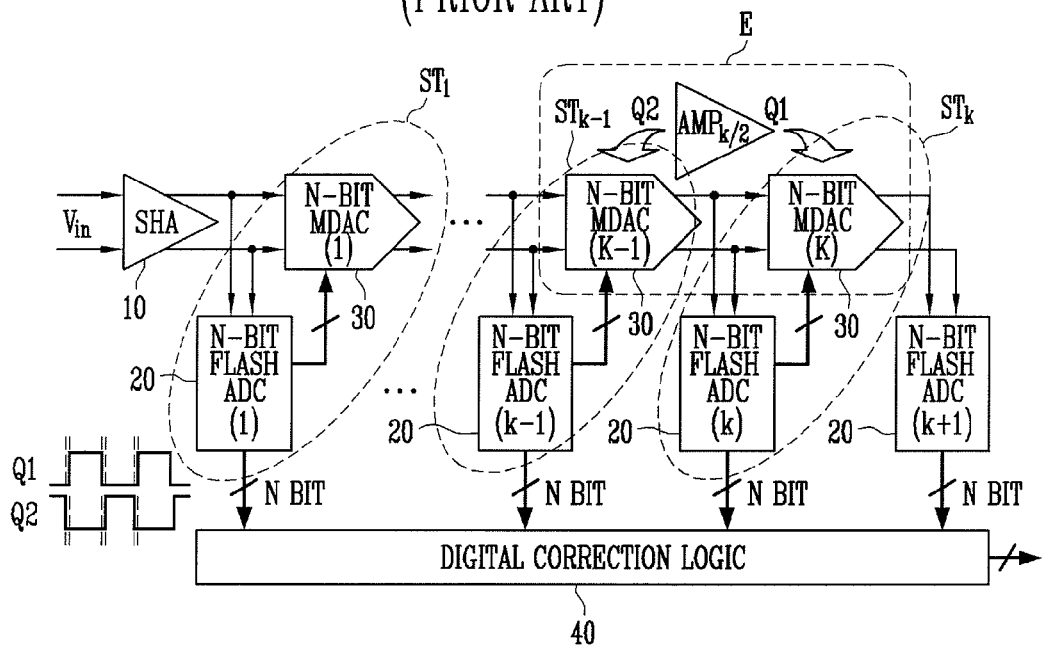
FIG. 1 is a circuit diagram of a conventional multi-bit pipeline analog-to-digital converter (ADC)
Figure 2:
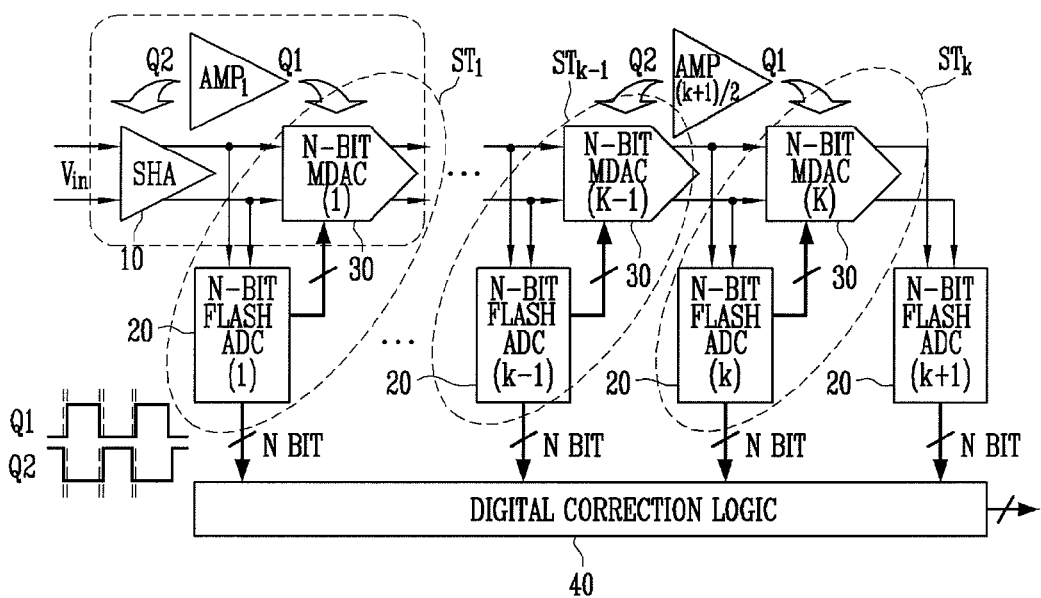
FIG. 2 is a circuit diagram of a multi-bit pipeline ADC having a shared amplifier structure according to an exemplary embodiment of the present invention.

FIG. 2 is a circuit diagram of a multi-bit pipeline analog-to-digital converter (ADC) having a shared amplifier structure according to an exemplary embodiment of the present invention.

As illustrated in FIG. 2, the multi-bit pipeline ADC according to the present invention comprises a sample-and-hold amplifier (SHA) 10 of an input terminal sampling and holding an input analog voltage, digital correction logic 40 for correcting errors in digital signals, and several stages. Each stage comprises an N-bit flash ADC 20 and an N-bit multiplying digital-to-analog converter (MDAC) 30. The N-bit flash ADC 20 receives an input analog signal of the preceding stage, converts it into a digital signal and outputs the digital signal. The N-bit MDAC 30 converts a difference between the digital signal output from the N-bit flash ADC 20 and an output signal of the preceding stage back into an analog signal and inputs it to the next stage. According to non-overlapping clocks Q1 and Q2, the SHA 10 and the MDAC 30 of a first stage MDAC1 share an amplifier $AMP_1$, and MDAC2, MDAC3, ..., MDAC(K-1) and MDAC(K) share amplifiers $AMP_2, ..., AMP_{(k+1)/2}$.

Here, the MDACs 30 respectively included in the stages have the same structure and feedback factor and thus can share the same single amplifier having one input and one output. Such a shared amplifier structure between MDAC 30 blocks can be easily understood by those of ordinary skill in the art, and thus a detailed description thereof will be omitted.

The principal characteristic of the present invention is the method of sharing the amplifier $AMP_1$ between the SHA 10 and the MDAC1 30. Therefore, the shared amplifier structure according to the present invention will be described in further detail below.

Figure 3:
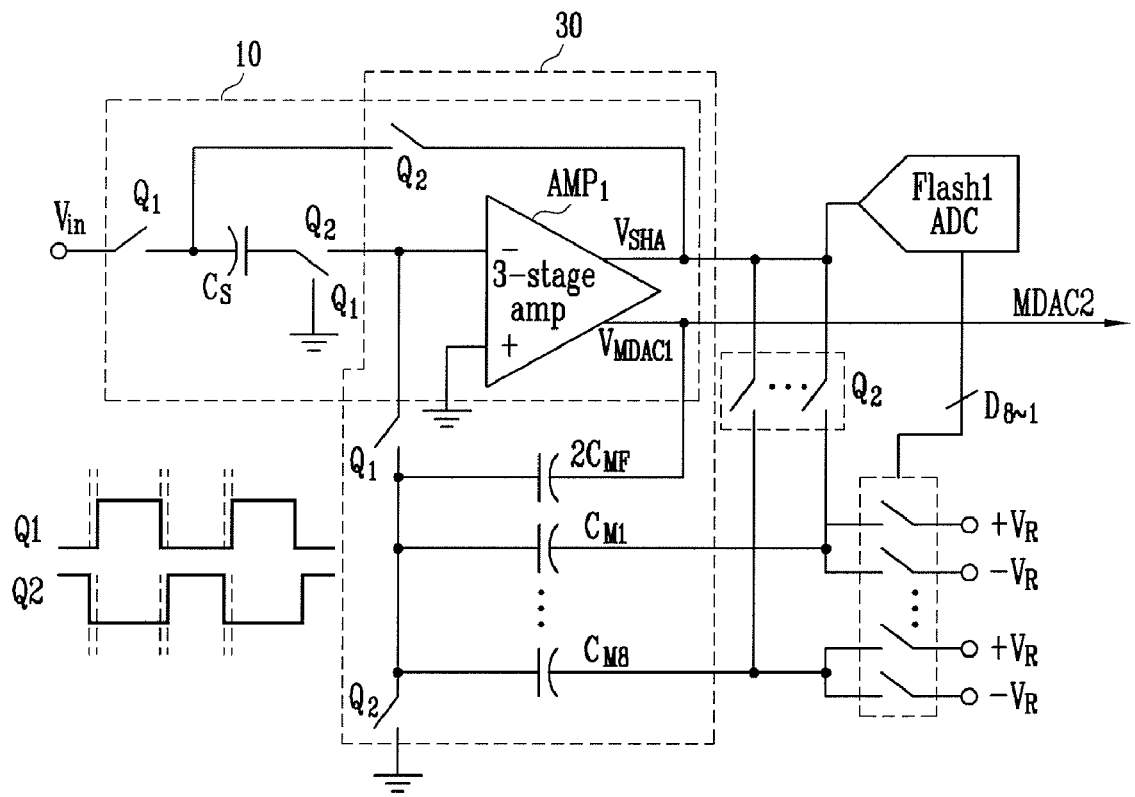
FIG. 3 is a circuit diagram illustrating the shared amplifier structure between a sample-and-hold amplifier (SHA) and multiplying digital-to-analog converter (MDAC) of FIG. 2.

FIG. 3 is a circuit diagram illustrating the shared amplifier structure between the SHA 10 and an MDAC1 30 of FIG. 2. $C_S$ is a capacitor used in the SHA 10, $C_{MF}$ and $C_{M1}$ to $C_{MN}$ are capacitors used in the MDAC1 30, and $+V_R$ and $-V_R$ are reference voltages. $C_{MF}$ and $C_{M1}$ to $C_{MN}$ all have the same capacitance as a unit capacitor $C_{unit}$.

As illustrated in FIG. 3, the present invention shares the three-stage amplifier $AMP_1$ between the SHA 10 and the MDAC1 30. When the clock Q1 is high, the SHA 10 is in sampling mode and the MDAC1 30 is in amplification mode. When the clock Q2 is high, the SHA 10 is in hold mode and the MDAC1 30 is in sampling mode.

The structure and operation of the three-stage amplifier $AMP_1$ will be described in further detail below with reference to FIG. 4.

Figure 4:
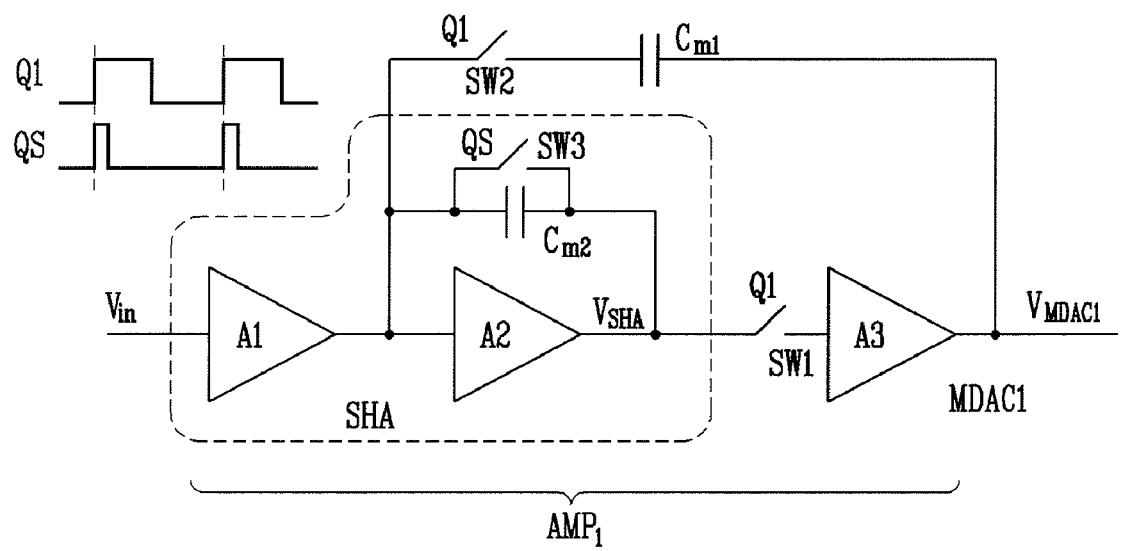
FIG. 4 is a circuit diagram illustrating the structure and operation of a three-stage amplifier of FIG. 3.

FIG. 4 is a circuit diagram illustrating the structure and operation of the three-stage amplifier $AMP_1$ of FIG. 3.

Referring to FIG. 4, a first amplifier A1 of the three-stage amplifier $AMP_1$ has a folded-cascade structure for obtaining a high DC gain. A second amplifier A2 and a third amplifier A3 have a 5-transistor structure for outputting a large signal at a low supply voltage of 1 V or less. Capacitors $C_{m1}$ and $C_{m2}$ are compensating capacitors for preventing resonance in a multi-stage amplifier.

Particularly, in the present invention, a switch SW1 using the clock Q1 is added between the second amplifier A2 and third amplifier A3 of the three-stage amplifier $AMP_1$. According to the switch SW1, the SHA 10 and the MDAC1 30 operate separately.

More specifically, at the clock Q1 at which the MDAC1 30 uses the amplifier, a three-stage amplifier A1-A2-A3 is connected to an output of the MDAC1 30. At the clock Q2 at which the SHA 10 uses the amplifier, a two-stage amplifier A1-A2 is connected to an output of the SHA 10.

Here, the third amplifier A3 that does not operate is supplied with half-power so as not to affect operation of the third amplifier A3 at the next clock phase, and thereby power consumption is minimized.

In this manner, amplifiers having different numbers of stages are used by the SHA 10 and the MDAC1 30 to simultaneously satisfy requirements on their operation characteristics. The SHA 10 requiring a large phase margin uses the A1-A2 amplifier at the clock Q2, and the MDAC1 30 requiring large gain uses the A1-A2-A3 amplifier at the clock Q1.

More specifically, by the three-stage amplifier $AMP_1$ constituted as shown in FIG. 4, the SHA 10 operates in sampling mode and the MDAC1 30 operates in amplification mode when the clock Q1 is high, and the SHA 10 operates in hold mode and the MDAC1 30 operates in sampling mode when the clock Q2 is high. This will be described in further detail below with reference to FIGS. 5 and 6.

Figure 5:
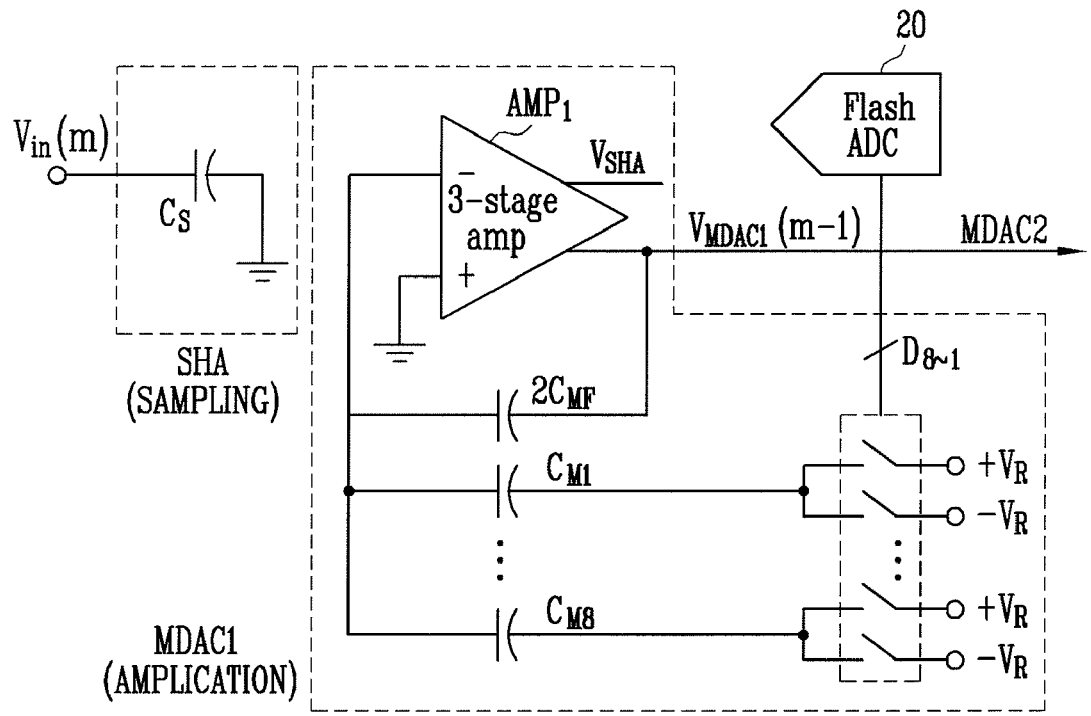
FIG. 5 is a circuit diagram of FIG. 3 at Q1 clock phase.
Figure 6:
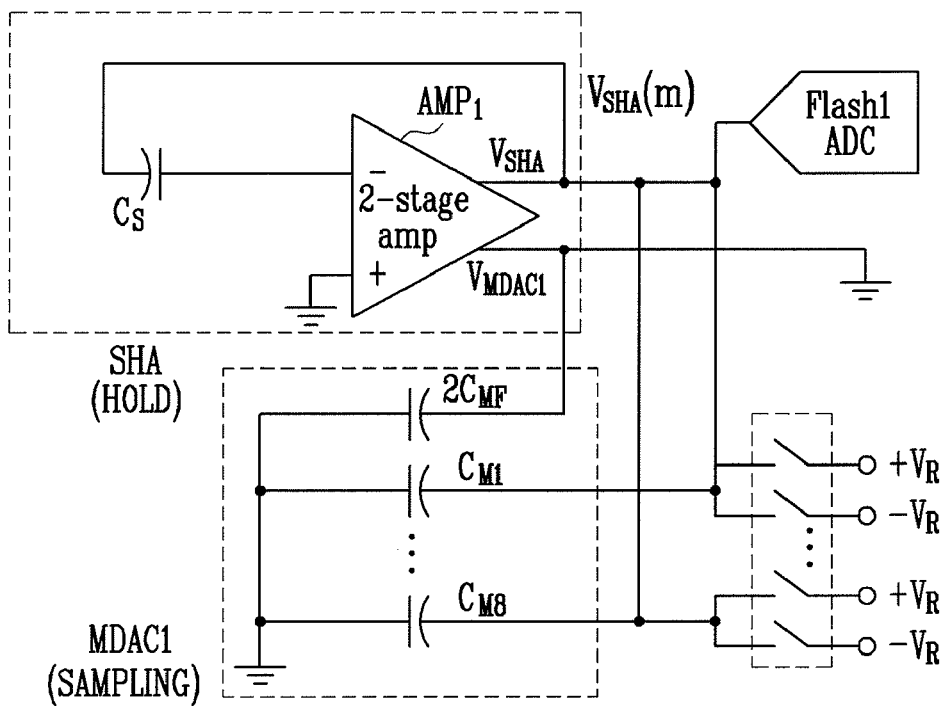
FIG. 6 is a circuit diagram of FIG. 3 at Q2 clock phase.

FIG. 5 is a circuit diagram of FIG. 3 at Q1 clock phase, and FIG. 6 is a circuit diagram of FIG. 3 at Q2 clock phase.

As illustrated in FIG. 5, the SHA 10 in sampling mode samples an m-th analog input signal Vin(m) using the capacitor $C_S$, and the MDAC1 30 in amplification mode compares a preceding output $V_{SHA}$(m-1) of the SHA 10 with a digital output value $D_{k(m-1)}*V_R$ of the ADC 20 and amplifies a residual voltage to $V_{MDAC}$.

As illustrated in FIG. 6, the SHA 10 in hold mode connects the two nodes of the capacitor $C_S$ respectively with an input and the output $V_{SHA}$ of the amplifier, thereby holding a sampled input signal.

Here, the capacitors of the MDAC1 30 are connected with the amplifier output $V_{SHA}$ and sample an output of the SHA 10.

In this way, the SHA 10 is designed to use only a two-stage amplifier having a large phase margin by adding the switch SW1 to the three-stage amplifier AMP$_1$ used for the MDAC1 30, so that the amplifier AMP$_1$ can be shared between the SHA 10 and the MDAC1 30. Thus, it is possible to not only significantly reduce power consumption of the third amplifier not used when the SHA 10 operates, but also minimize chip size by sharing amplifiers.

Meanwhile, the shared amplifier structure of the present invention can be modified by adjusting the number of stages in the multi-stage amplifier structure.

As described above, according to the present invention, it is possible to share an amplifier between an SHA consuming much power and an MDAC of a first stage in a multi-bit pipeline ADC. Therefore, power consumption and chip size can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multi-bit pipeline analog-to-digital converter (ADC) having a shared amplifier structure, comprising:
    a sample-and-hold amplifier (SHA) for sampling and holding an input analog voltage and removing a sampling error of the input voltage;
    N-bit flash ADCs of first to K-th stages for receiving analog signals, converting them into digital signals, and outputting the digital signals;
    N-bit multiplying digital-to-analog converters (MDACs) of the first to K-th stages for converting differences between digital signals output from the N-bit flash ADCs and output signals of preceding stages back into analog signals and outputting the analog signals; and
    a three-stage amplifier connected with an output of the N-bit MDAC of the first stage at a first clock and an output of the SHA at a second clock,
    wherein N is an integer greater than or equal to 1 and K is an integer greater than or equal to 2.

2. The multi-bit pipeline ADC of claim 1, further comprising:
    a switch interposed between a second amplifier and third amplifier of the three-stage amplifier and turned on/off in response to the first clock.

3. The multi-bit pipeline ADC of claim 2, wherein first, second and third amplifiers of the three-stage amplifier are connected with the output of the N-bit MDAC of the first stage at the first clock and the first and second amplifiers are connected with the output of the SHA at the second clock.

4. The multi-bit pipeline ADC of claim 3, wherein power applied to the third amplifier of the three-stage amplifier is reduced at the second clock.

5. The multi-bit pipeline ADC of claim 1, wherein the SHA operates in sampling mode and the N-bit MDAC of the first stage operates in amplification mode when the first clock is high, and the SHA operates in hold mode and the N-bit MDAC of the first stage operates in sampling mode when the second clock is high.

6. The multi-bit pipeline ADC of claim 1, wherein an amplifier is shared between the MDACs of the second to K-th stages.

* * * * *